United States Patent
Sharma et al.

(10) Patent No.: US 12,438,535 B2
(45) Date of Patent: Oct. 7, 2025

(54) SYSTEM AND METHODS FOR MOTOR DRIVE USING GAN SYNCHRONOUS RECTIFICATION

(71) Applicant: Navitas Semiconductor Limited, Dublin (IE)

(72) Inventors: Santosh Sharma, Austin, TX (US); Thomas Ribarich, Laguna Beach, CA (US); Matteo Uccelli, Milan (IT); Victor Sinow, Fresno, CA (US)

(73) Assignee: Navitas Semiconductor Limited, Dublin (IE)

( * ) Notice: Subject to any disclaimer, the term of this patent is extended or adjusted under 35 U.S.C. 154(b) by 386 days.

(21) Appl. No.: 18/189,123

(22) Filed: Mar. 23, 2023

(65) Prior Publication Data

US 2023/0308091 A1    Sep. 28, 2023

Related U.S. Application Data

(60) Provisional application No. 63/323,442, filed on Mar. 24, 2022.

(51) Int. Cl.
*H03K 17/06* (2006.01)
*H03K 17/10* (2006.01)

(52) U.S. Cl.
CPC ......... *H03K 17/102* (2013.01); *H03K 17/063* (2013.01); *H03K 2217/0063* (2013.01); *H03K 2217/0072* (2013.01)

(58) Field of Classification Search
CPC ............... H03K 17/063; H03K 17/102; H03K 2217/0063; H03K 2217/0072
USPC .................................................. 327/108, 110
See application file for complete search history.

(56) References Cited

U.S. PATENT DOCUMENTS

| | | | |
|---|---|---|---|
| 10,536,070 B1 * | 1/2020 | Penzo | H02M 3/158 |
| 2016/0079979 A1 * | 3/2016 | Kinzer | H01L 23/49562 |
| | | | 327/333 |
| 2016/0261214 A1 * | 9/2016 | Greetham | H02P 6/14 |
| 2017/0170731 A1 * | 6/2017 | Marini | G01R 15/144 |
| 2023/0370059 A1 * | 11/2023 | Chen | H03K 17/08142 |
| 2023/0421085 A1 * | 12/2023 | Greetham | H02P 6/085 |

* cited by examiner

*Primary Examiner* — William Hernandez
(74) *Attorney, Agent, or Firm* — FisherBroyles, LLP

(57) ABSTRACT

Systems and methods for a GaN-based motor drive circuit using synchronous rectification is disclosed. In one aspect, a method of operating a motor drive circuit includes providing a half-bridge circuit including a high-side GaN switch and a low-side GaN switch coupled in series at an output node, providing a motor coupled to the output node, turning on the high-side GaN switch such that a first current flows through the motor, turning off the high-side GaN switch, turning on the low-side GaN switch when a voltage at the output node drops below a predetermined threshold voltage, sensing, using a sense device coupled to the low-side GaN switch, a magnitude of a second current that flows through the low-side GaN switch, and turning off the low-side GaN switch when the magnitude of the second current drops below a predetermined threshold current.

20 Claims, 9 Drawing Sheets

SYSTEM AND METHODS FOR MOTOR DRIVE USING GAN SYNCHRONOUS RECTIFICATION

CROSS REFERENCE TO RELATED APPLICATION

This application claims priority to U.S. provisional patent application Ser. No. 63/323,442, for "System and Methods for Motor Drive Using Gan Synchronous Rectification" filed on Mar. 24, 2022, which is hereby incorporated by reference in entirety for all purposes.

FIELD

The described embodiments relate generally to motor drive circuits, and more particularly, the present embodiments relate to system and methods for motor drive using gallium nitride (GaN) synchronous rectification.

BACKGROUND

Electric circuits can be used for controlling inductive loads such as those constituted, e.g., by the coils of individual phases of an electric motor, by using power stages. As many electrical devices are sensitive to size and efficiency of the power stages, new power stages can provide relatively higher efficiency and lower size for the electrical devices.

SUMMARY

In some embodiments, a method of operating a motor drive circuit is disclosed. The method includes providing a half-bridge circuit that has a high-side gallium nitride (GaN) switch having a first gate terminal, a first drain terminal and a first source terminal; and a low-side GaN switch having a second gate terminal, a second drain terminal and a second source terminal, where the first drain terminal is coupled to a power supply, the first source terminal is coupled to the second drain terminal at an output node and the second source terminal is coupled to a ground; providing a motor coupled to the output node; turning on the high-side GaN switch such that a first current flows through the motor; turning off the high-side GaN switch; turning on the low-side GaN switch when a voltage between the second drain terminal and the second source terminal drops below a predetermined threshold voltage; sensing, using a sense device coupled to the low-side GaN switch, a magnitude of a second current that flows through the low-side GaN switch; and turning off the low-side GaN switch when the magnitude of the second current drops below a predetermined threshold current.

In some embodiments, the turning on the low-side GaN switch is performed within a predetermined period of time after a control signal that controls a conductivity state of the high-side GaN switch goes high.

In some embodiments, the method further includes turning off the low-side GaN switch prior to turning on the high-side GaN switch if a control signal that controls a conductivity state of the high-side GaN switch goes high after the low-side GaN switch is turned on.

In some embodiments, the predetermined threshold current has a value that is 10% of a rated current of the low-side GaN switch.

In some embodiments, the predetermined threshold voltage is a first predetermined threshold voltage, and the method further includes transmitting an arming signal to the low-side GaN switch when the voltage between the second drain terminal and the second source terminal exceeds a second predetermined threshold voltage, and the arming signal goes low prior to the low-side GaN switch turning on.

In some embodiments, a value of the first predetermined threshold voltage is −1.0 V, and a value of the second predetermined threshold voltage is 12.0 V.

In some embodiments, the half-bridge circuit is a first half-bridge circuit and the output node is a first output node, where the method of claim 1 further includes a second half-bridge circuit having a second output node, wherein the motor is coupled between the first output node and the second output node.

In some embodiments, a circuit is disclosed. The circuit includes a high-side gallium nitride (GaN) switch having a first gate terminal, a first drain terminal and a first source terminal; a low-side GaN switch having a second gate terminal, a second drain terminal and a second source terminal, where the first drain terminal is coupled to a power supply, the first source terminal is coupled to the second drain terminal at an output node and the second source terminal is coupled to a ground; a drive circuit coupled to the high-side GaN switch and to the low-side GaN switch; and a sense device coupled to the low-side GaN switch and arranged to sense a magnitude of a current that flows through the low-side GaN switch; where the drive circuit is arranged to: turn on the high-side GaN switch when a control signal that controls a conductivity state of the high-side GaN switch goes high; turning off the high-side GaN switch when the control signal goes low; turn on the low-side GaN switch when a voltage between the second drain terminal and the second source terminal drops below a predetermined threshold voltage; and turn off the low-side GaN switch when the magnitude of the current drops below a predetermined threshold current.

In some embodiments, the drive circuit is further arranged to turn on the low-side GaN switch within a predetermined period of time after the control signal goes high.

In some embodiments, the drive circuit is further arranged to turn off the low-side GaN switch prior to turning on the high-side GaN switch if the control signal goes high after the low-side GaN switch is turned on.

In some embodiments, the predetermined threshold current has a value that is 10% of a rated current of the low-side GaN switch.

In some embodiments, the predetermined threshold voltage is a first predetermined threshold voltage, and the drive circuit is further arranged to transmit an arming signal to the low-side GaN switch when the voltage between the second drain terminal and the second source terminal exceeds a second predetermined threshold voltage, and to set the arming signal to a low state prior to the low-side GaN switch turning on.

In some embodiments, a value of the first predetermined threshold voltage is −1.0 V, and wherein a value of the second predetermined threshold voltage is 12.0 V.

In some embodiments, the drive circuit is formed in silicon.

In some embodiments, a method of operating a motor drive circuit is disclosed. The method includes providing a half-bridge circuit including: a high-side gallium nitride (GaN) switch having a first gate terminal, a first drain terminal and a first source terminal; and a low-side GaN switch having a second gate terminal, a second drain terminal and a second source terminal, wherein the first drain terminal is coupled to a power supply, the first source terminal is coupled to the second drain terminal at an output node and the second source terminal is coupled to a ground; providing a motor coupled to the output node; turning on the high-side GaN switch such that a first current flows through the motor; turning off the high-side GaN switch; turning on the low-side GaN switch when a voltage between the second drain terminal and the second source terminal drops below a predetermined threshold voltage; and turning off the low-side GaN switch when the voltage between the second drain terminal and the second source terminal exceeds the predetermined threshold voltage.

In some embodiments, the turning on the low-side GaN switch is performed within a predetermined period of time after a control signal that controls a conductivity state of the high-side GaN switch goes high.

In some embodiments, the method further comprises providing a drive circuit coupled to the high-side GaN switch and to the low-side GaN switch.

In some embodiments, the drive circuit includes a comparator arranged to detect the voltage between the second drain terminal and the second source terminal.

DETAILED DESCRIPTION

Figure 1:
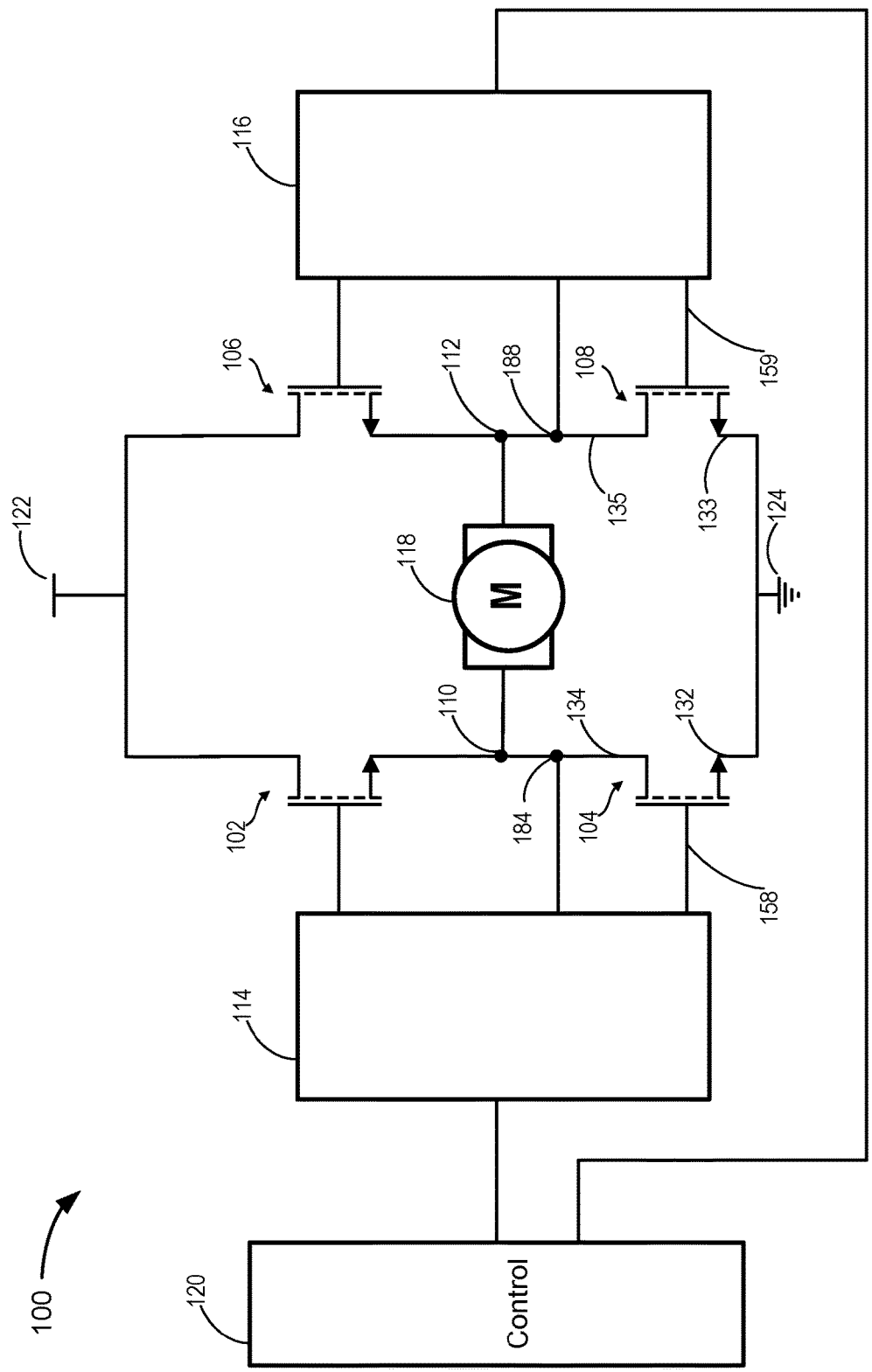
FIG. 1 illustrates a schematic of a GaN half-bridge motor drive circuit, according to an embodiment of the disclosure.

Circuits, devices and related techniques disclosed herein relate generally to motor drive circuits that use gallium nitride (GaN) switches. More specifically, the present disclosure is related to systems and methods for motor drive circuits using synchronous rectification in GaN half-bridge circuits. The GaN half-bridge circuit can include a high-side switch and a low-side switch. In some embodiments, when the high-side switch turns off causing the low-side switch to enter its third quadrant mode of operation, the low-side switch may autonomously control its turn on and turn off. The low-side switch can detect when it enters third quadrant mode of operation and turn itself on, and it can further detect when the third quadrant mode of operation is over and turn itself off. A third quadrant mode of operation is where a current through a GaN switch flows from its source terminal to its drain terminal. Embodiments of the present disclosure can substantially increase operational efficiency of the GaN motor drive circuit by enabling the low-side switch to turn on during the third quadrant mode of operation and to turn itself off promptly when the third quadrant mode of operation is over. Particularly, embodiments of the disclosure can be advantageous where a GaN switch lacks a body diode, or the GaN switch may have a body diode that has a relatively high operating voltage which can cause relatively high power losses in the body diode during third quadrant mode of operation. A relatively high power loss in the body diode during third quadrant mode of operation can result in reduced operational efficiency of the motor drive circuit. In some embodiments, a control circuit may transmit a relatively short pulse to the low-side switch indicating that the low-side switch may be turned off after autonomous turn-on was initiated.

In some embodiments, the GaN half-bridge circuit can be driven by drive circuits that are formed within the same GaN die that includes the switches of the GaN half-bridge circuit. The drive circuits may further include high voltage GaN-based voltage sensing transistors. By forming the drive circuits within a monolithic GaN die along with the high voltage sensing transistors, the drive circuit and the half-bridge GaN circuit can be closely coupled so as to avoid communicating control, sense and drive signals to a separate integrated circuit (IC). Communicating control, sense and drive signals, particularly high voltage and/or high speed signals, through electronic packages and across a circuit board can introduce unwanted ringing and oscillations, and possible corruption of the signals, resulting in a malfunction of the motor drive circuit. In various embodiments, the disclosed autonomous turn-on and turn-off techniques can be used to control conductivity state of a single switch. The single switch may be arranged to generate signals that provide statuses of its terminal voltages and/or currents flowing though the switch.

In various embodiments, the motor drive circuit can prevent an unwanted turn-on of the low-side GaN switch. An unwanted turn-on of a low-side GaN switch may occur due to relatively large voltage oscillations on a switch node of the motor drive circuit's half-bridge. Relatively large voltage oscillations on the switch node can be a common occurrence in motor drives due to the relatively large inductance of the motor. Various embodiments are illustrated in the figures showing GaN half-bridge circuits, control and drive circuits. Various inventive embodiments are described herein, including methods, processes, systems, devices, and the like.

Several illustrative embodiments will now be described with respect to the accompanying drawings, which form a part hereof. The ensuing description provides embodiment (s) only and is not intended to limit the scope, applicability, or configuration of the disclosure. Rather, the ensuing description of the embodiment(s) will provide those skilled in the art with an enabling description for implementing one or more embodiments. It is understood that various changes may be made in the function and arrangement of elements without departing from the spirit and scope of this disclosure. In the following description, for the purposes of explanation, specific details are set forth in order to provide a thorough understanding of certain inventive embodiments. However, it will be apparent that various embodiments may be practiced without these specific details. The figures and description are not intended to be restrictive. The word "example" or "exemplary" is used herein to mean "serving as an example, instance, or illustration." Any embodiment or design described herein as "exemplary" or "example" is not necessarily to be construed as preferred or advantageous over other embodiments or designs.

FIG. 1 illustrates a schematic of a GaN half-bridge motor drive circuit 100 according to an embodiment of the disclosure. The GaN half-bridge motor drive circuit 100 can include a first GaN half-bridge circuit having a high-side GaN switch 102 connected in series to a low-side GaN switch 104 at a first switch node 110. The low-side GaN switch 104 can include a drain terminal 134, a source terminal 132 and a gate terminal 158. The GaN half-bridge motor drive circuit 100 can further include a second GaN half-bridge circuit having a high-side GaN switch 106 connected in series to a second half-bridge low-side GaN switch 108 at a second switch node 112. The low-side GaN switch 108 can include a drain terminal 135, a source terminal 133 and a gate terminal 159. In various embodiments, the GaN half-bridge motor drive circuit 100 may include a third half-bridge circuit having high-side and low-side GaN switches.

The first and second GaN half-bridge circuits are connected between a Vdd terminal 122 and ground node 124. A motor 118 may be connected between the first switch node 110 and the second switch node 112. The GaN half-bridge motor drive circuit 100 can further include a first drive circuit 114 coupled to the first GaN half-bridge circuit, and a second drive circuit 116 coupled to the second GaN half-bridge circuit. The first drive circuit 114 can be coupled to the drain terminal 134 at node 184. The second drive circuit 116 can be coupled to the drain terminal 135 at node 188. The first and second drive circuits 114 and 116, respectively, can be coupled to a control circuit 120. The control circuit 120 can be arranged to send control signals to the first and second drive circuits 114 and 116. The control circuit 120 can be further arranged to receive sense signals from the first and second drive circuits 114 and 116.

Figure 2:
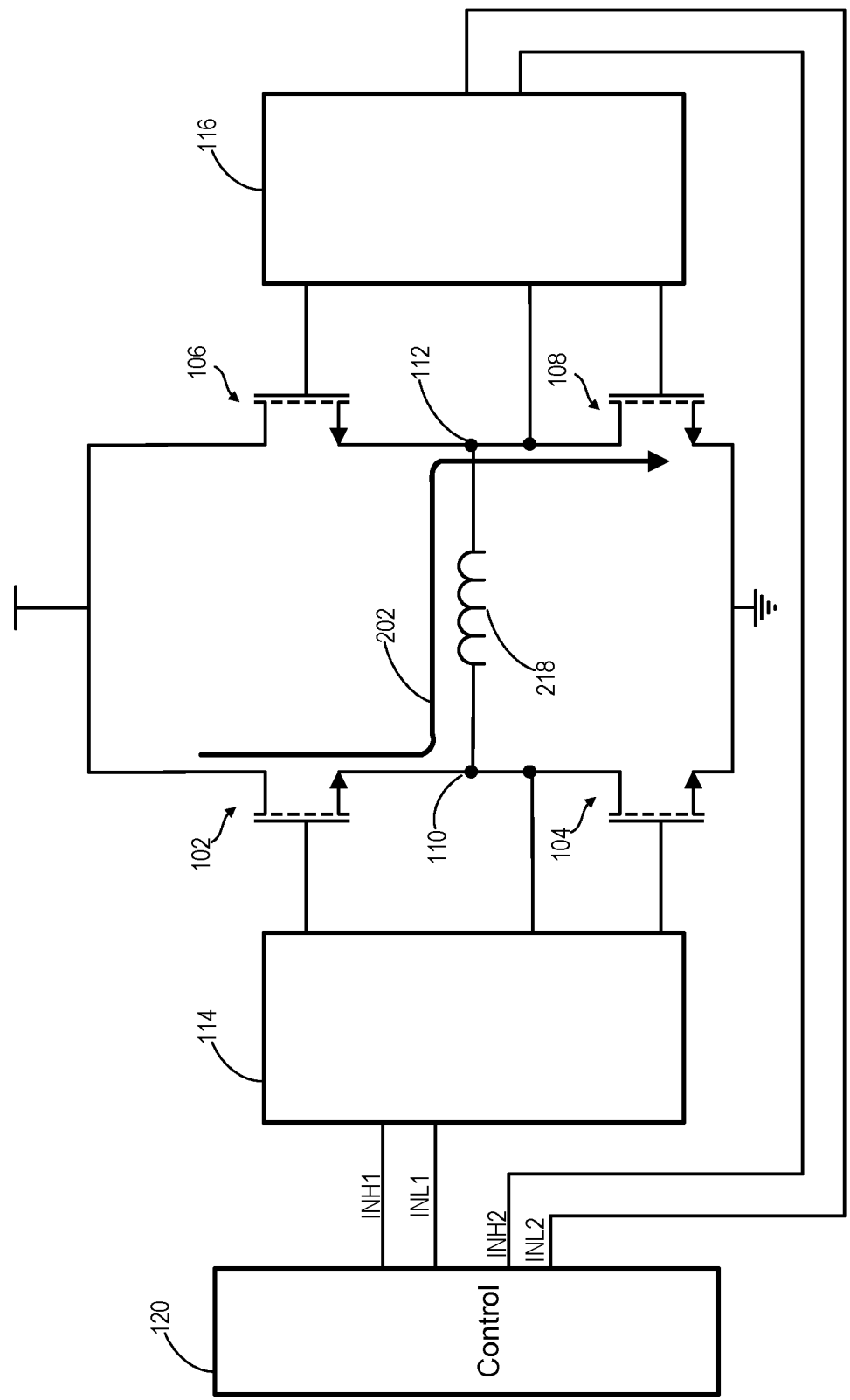
FIG. 2 illustrates a current flow through the GaN half-bridge motor drive circuit of FIG. 1, according to an embodiment of the disclosure.

FIG. 2 illustrates a current flow through the GaN half-bridge motor drive circuit 100 according to an embodiment of the disclosure. FIG. 2 is similar to FIG. 1, except in FIG. 2 the motor 118 has been replaced by an equivalent motor inductor 218. Control circuit 120 can be arranged to generate control signals to control conductivity state of the GaN switches of the first half-bridge circuit and the second half bridge circuit. INH1 signal may be a control signal used to control the conductivity state of the high-side GaN switch 102. INH2 signal may be a control signal used to control the conductivity state of the high-side GaN switch 106. INL1 signal may be a control signal used to control the conductivity state of the low-side GaN switch 104. INL2 signal may be a control signal used to control the conductivity state of the low-side GaN switch 108. During a first time period when INH1 and INL2 are high, a current 202 may flow from the high-side GaN switch 102 to the motor inductor 218 to the second half-bridge low-side GaN switch 108. When the signal INH goes low, the high-side GaN switch 102 can turn off.

Figure 3:
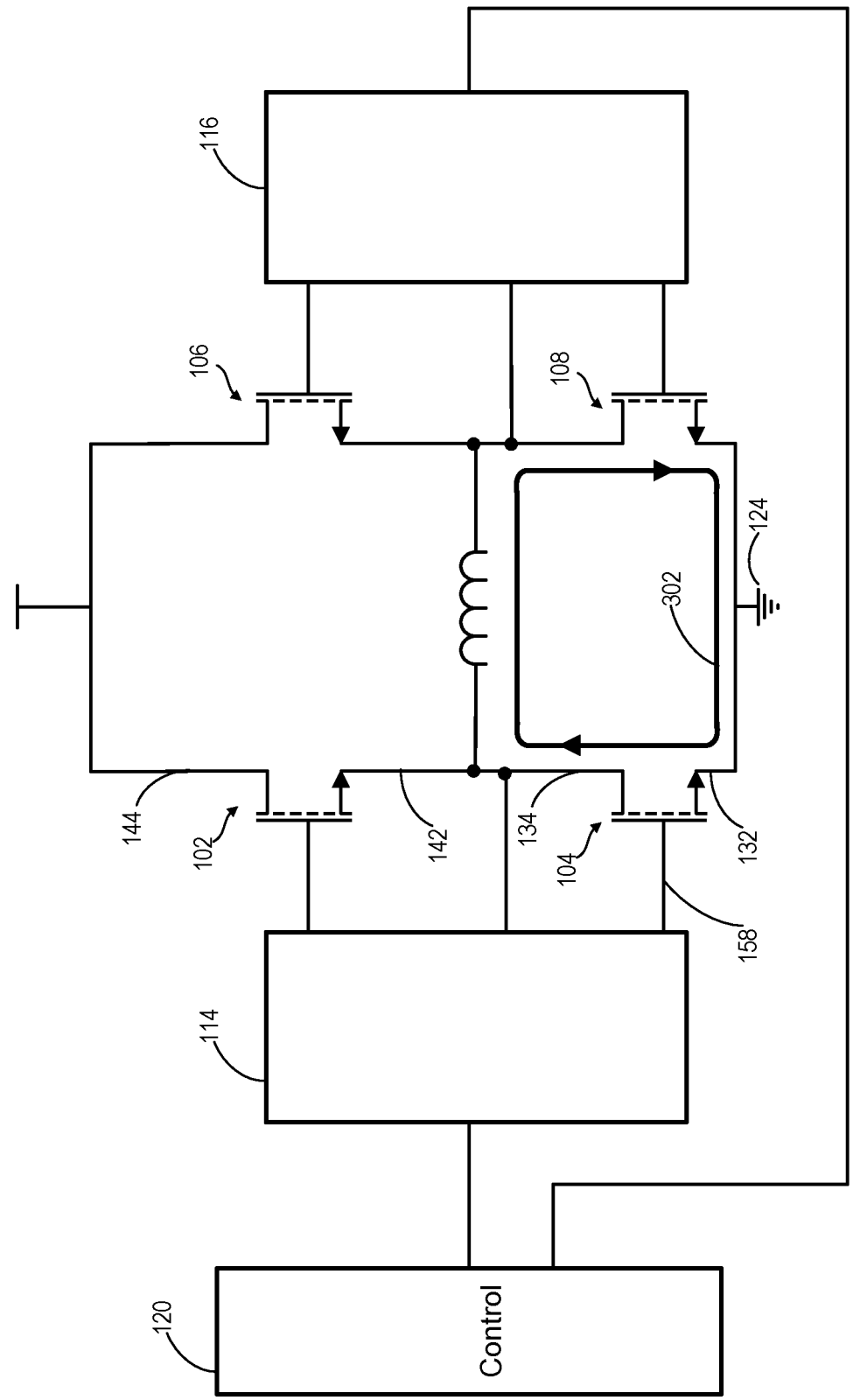
FIG. 3 shows a current flow through the GaN half-bridge motor drive circuit of FIG. 1 when the high-side GaN switch is in an off state subsequent to the motor inductor magnetization.

FIG. 3 shows a current flow when the high-side GaN switch 102 is in an off state subsequent to the motor inductor 218 magnetization. Signal INH has gone low, thus turning off the high-side GaN switch 102. The low-side GaN switch 104 can be turned on such that a free-wheeling current 302 can flow though the low-side GaN switch 104. In this mode of operation, current 302 can flow from a source terminal 132 to drain terminal 134 of the low-side GaN switch 104. This is when the low-side GaN switch 104 may be operating in its third quadrant mode of operation, i.e., the source terminal 132 voltage may be at a higher voltage than the drain terminal 134 voltage. A GaN switch may not have a body diode, or its body diode may have relatively high on-resistance during turn-on.

In order to prevent high conduction losses in the third quadrant mode of operation, the low-side GaN switch 104 can be turned on such that a current 302 flows from its source terminal 132 to its drain terminal 134. In some embodiments, the low-side GaN switch 104 can have bidirectional characteristics such that current may flow from its source terminal to its drain terminal. By turning on the low-side GaN switch 104 during its third quadrant mode of operation, the operational efficiency of the GaN half-bridge motor drive circuit 100 can be increased by avoiding losses associated with the body diode of the low-side GaN switch 104. Embodiments of the disclosure enable a precise turn on and turn off of the low-side GaN switch 104 so as to improve efficiency of the motor drive circuit. In some embodiments, when a current is flowing from a source terminal 142 to a drain terminal 144 in the high-side GaN switch 102, the low-side GaN switch 104 may autonomously turn on.

Figure 4:
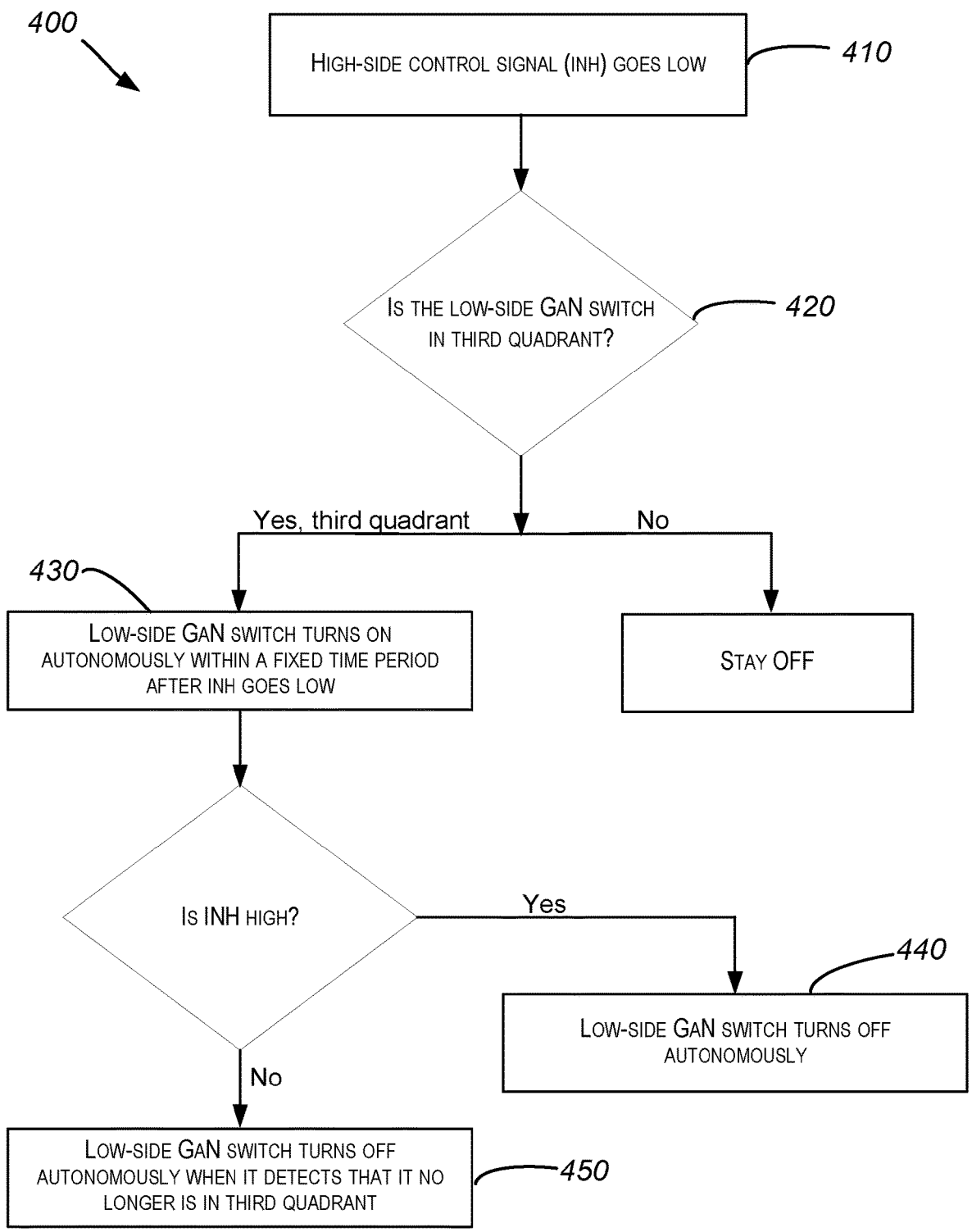
FIG. 4 illustrates steps associated with a method of autonomously controlling a low-side GaN switch in a half-bridge circuit, according to certain embodiments.

FIG. 4 illustrates steps associated with a method 400 of autonomously controlling a low-side GaN switch in a half-bridge circuit, according to certain embodiments. In step 410, a high-side control signal (INH) goes low. In step 420, a drain terminal voltage of the low-side GaN switch 104 is sensed to detect when the low-side GaN switch 104 enters its third quadrant mode of operation. In step 430, the low-side GaN switch 104 autonomously turns on within a fixed time period after INH goes low when the low-side GaN switch 104 enters its third quadrant mode of operation. In step 440, the low-side GaN switch 104 is turned off If INH comes in to turn on the high-side GaN switch 102, i.e., continuous conduction mode (CCM operation), the low-side GaN switch 104 is first turned OFF before high-side GaN switch 102 can turn on. In step 450, the low-side GaN switch 104 can autonomously turn off when it detects that it is no longer operating in the third quadrant mode of operation. It will be appreciated that method 400 is illustrative and that variation and modifications are possible. Steps described as sequential may be executed in parallel, order of steps may be varied, and steps may be modified, combined, added or omitted.

Figure 5A:
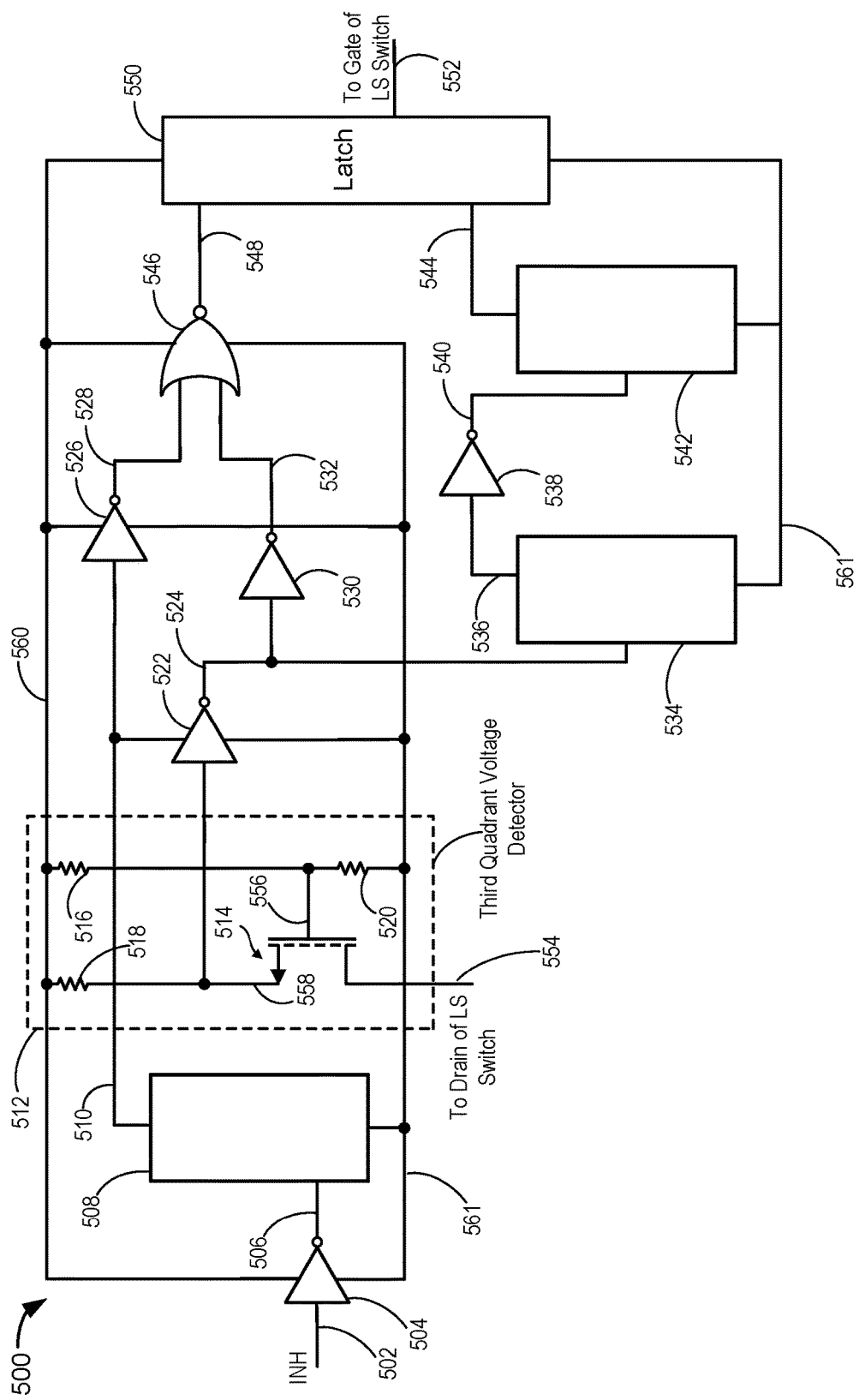
FIG. 5A illustrates a schematic of an autonomous turn-on circuit for turning on the low-side GaN switch in the half-bridge circuit, according to an embodiment of the disclosure.

FIG. 5A illustrates a schematic of an autonomous turn-on circuit 500 for turning on the low-side GaN switch 104, according to an embodiment of the disclosure. In some embodiments, autonomous turn-on circuit 500 can be included as part of the first and second drive circuits 114 and 116. Circuit 500 can include an input node 502 coupled to an inverter 504 having an output node 506. The output of the inverter 504 may be connected to an input of a first pulse generator circuit 508. The output node 510 of the first pulse generator circuit 508 can be connected to an inverter 526 having an output node 528.

Circuit 500 can further include a third quadrant voltage detector circuit 512. The third quadrant voltage detector circuit 512 can include a sensing transistor 514. In various embodiments, the sensing transistor 514 may be GaN-based. In some embodiments, the sensing transistor 514 may have a relatively high operating voltage, for example, 650 V. A gate 556 of the sensing transistor 514 can be connected to an intermediate node of a resistor divider formed by resistors 516 and 520. A drain 554 of the sensing transistor 514 may be coupled to a drain terminal 134 of the low-side GaN switch 104. A source 558 of the sensing transistor 514 may be connected through a resistor 518 to a Vdd node 560. A low side node of circuit 500 can be connected to a node 561.

In some embodiments, node 561 can be connected to a switch node, such as the first switch node 110. In other embodiments, node 561 can be connected to a ground node 124.

An output of the third quadrant voltage detector circuit 512 can be connected to an inverter 522 having an output node 524. The output node 524 can be connected to an inverter 530 having an output node 532. The output node 524 can also be connected to a second pulse generator circuit 534. An output node 536 of the second pulse generator circuit 534 can be connected to an inverter 538 having an output node 540. The output node 540 can be connected to an input node of a third pulse generator circuit 542. The output node 544 of the third pulse generator circuit 542 can be connected to Reset input of an SR latch 550. The output node 528 of the inverter 526 and the output node 532 of the inverter 530 can be connected to inputs of a NOR gate 546 having an output node 548. The output node 548 can be connected to a Set input of the SR latch 550. The output node 552 of the SR latch can be coupled to a gate of the low-side GaN switch 104. In some embodiments, the output node 552 of the SR latch can be coupled to the gate of the low-side GaN switch 104 through a gate driver circuit.

Figure 5B:
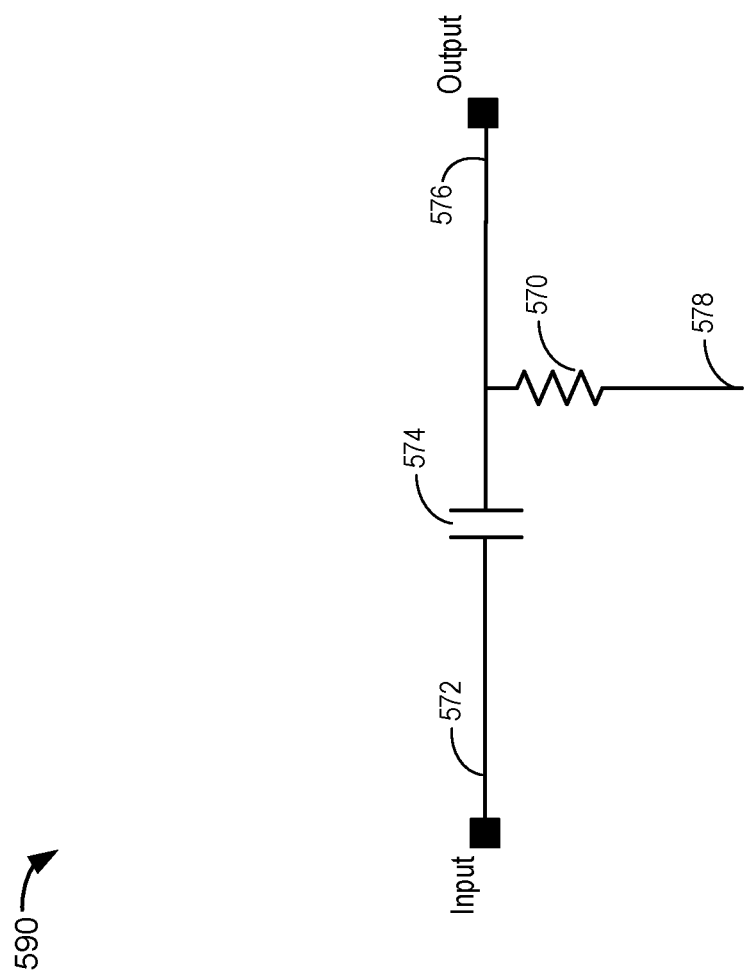
FIG. 5B illustrates a schematic of a pulse generator circuit of the autonomous turn-on circuit, according to an embodiment of the disclosure.

FIG. 5B illustrates a schematic of a pulse generator circuit 590 according to an embodiment of the disclosure. The pulse generator circuit 590 can be utilized in circuit 500. The pulse generator circuit 590 can include an input node 572, an output node 576 and a low side node 578. In some embodiments, the low side node 578 can be connected to a switch node, such as the first switch node 110. In various embodiments, the low side node 578 can be connected to ground. The pulse generator circuit 590 can further include a capacitor 574 and a resistor 570. A capacitance value C of the capacitor 574 and a value of the resistance R of the resistors 570 can set a time constant of the pulse generator circuit 590 proportional to a value of RC.

Operation of circuit 500 is now described while simultaneously referring to FIGS. 1, 2, 3, 5A, 5B and 6. When the drain-to-source (VDS) voltage of the low-side GaN switch 104 is high, for example, 12.5 V, it can signify that the low-side GaN switch 104 is off. When VDS is high, the first drive circuit 114 can generate an arming signal in a high state that signifies that the drive circuit can operate in synchronous rectification mode. When VDS falls below a predefined threshold, for example, minus-one volt, the autonomous turn-on circuit 500 can automatically activate itself without using any signals from the control circuit 120, and send a high signal to the gate terminal 158 of the low-side GaN switch 104. In some embodiments, a minimum on-time (MOT blanking signal) may be used, for example, 80 ns, to reject any ringing/noise. In various embodiments, a zero current detection (ZCD) comparator can be used to send a turn-off signal to the low-side GaN switch 104. During the time that the MOT blanking signal is low, signals to the gate terminal 158 instructing the low-side GaN switch 104 to turn-off may be ignored. Once the low-side GaN switch 104 has turned on, the arming signal can go low. This is to signify that the low-side GaN switch 104 is on and in operational mode.

Figure 6:
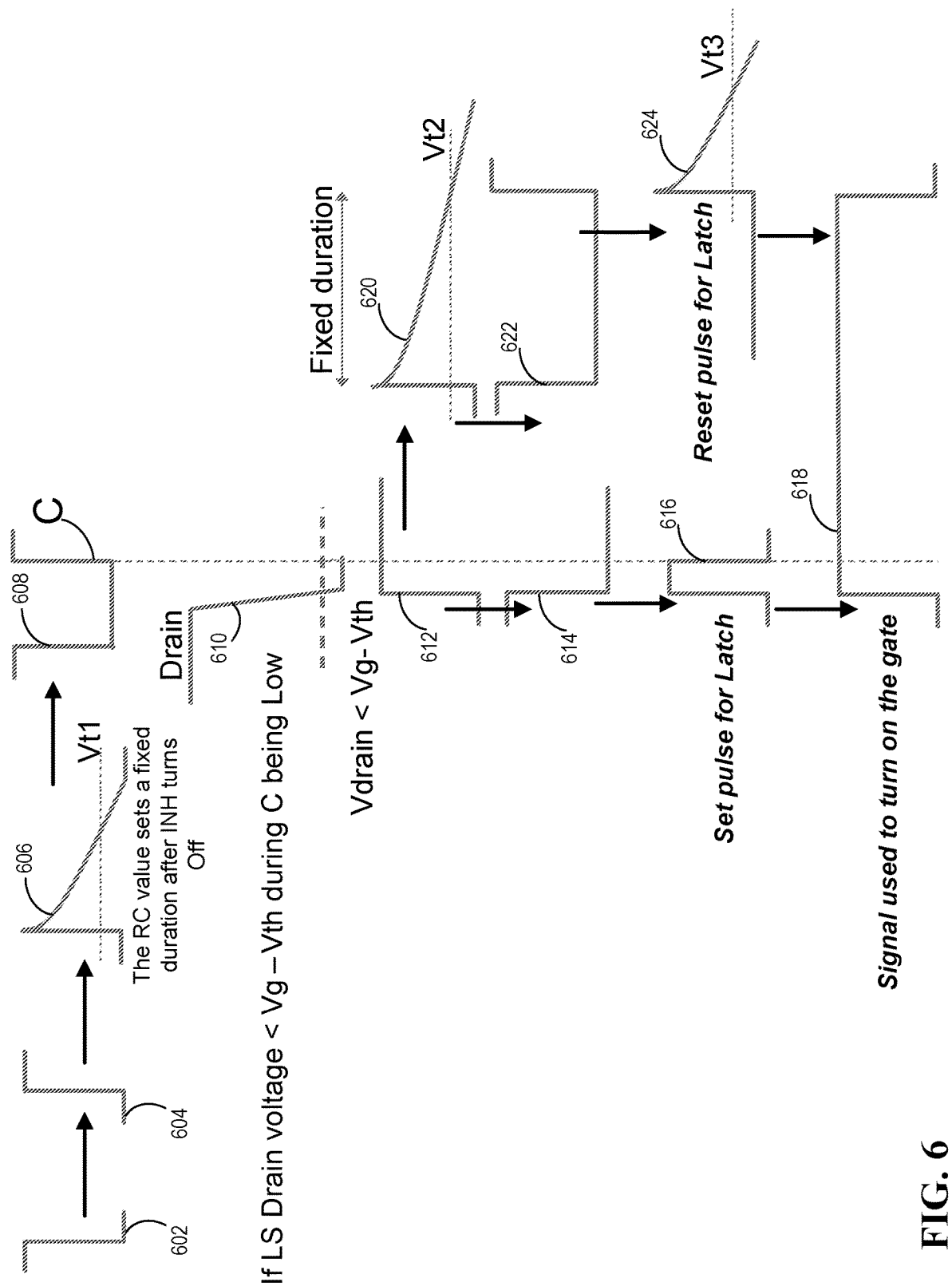
FIG. 6 illustrates various signals at different nodes of the circuits of FIGS. 5A and 5B, according to certain embodiments.

Circuit 500 can autonomously turn on the low-side GaN switch 104 when a third quadrant voltage on a drain of the low-side GaN switch 104 is detected within a fixed time duration after the high-side signal INH goes low. The high-side signal INH can be received at input node 502. FIG. 6 illustrates various signals at different nodes of the circuit 500, and pulse generator circuit 590. When the high-side signal INH goes from high to low as shown in diagram 602, it turns off the high-side GaN switch 102. An output signal at output node 506 is shown in diagram 604, where the signal goes from low to high. The signal at output node 506 is received by the first pulse generator circuit 508 and an output signal at node 510 is generated as shown in diagram 606. As shown in FIG. 5A, a resistance value R and a capacitance value C in the first pulse generator circuit 508 can set a fixed time duration. As shown in diagram 606 a pulse is generated that decays with a time constant proportional to the value of RC.

The pulse signal at node 510 is received by the inverter 526 and an output signal at node 528 is generated as shown in diagram 608. When the signal in diagram 606 exceeds a first threshold voltage value $V_{T1}$, the inverter 526 triggers and generates an output signal at node 528 which is an inverted signal of its input, i.e., a low signal is generated. When the signal in diagram 606 falls below the first threshold voltage value $V_{T1}$, the inverter 526 triggers and generates an output signal at node 528 which is an inverted signal, i.e., a high signal is generated. Therefore, the signal at node 528 (C) is a pulse signal with a fix time duration.

The third quadrant voltage detector circuit 512 can be coupled to the drain of the low-side GaN switch 104. When the high-side GaN switch 102 turns off, a current 302 may flow through the second half-bridge low-side GaN switch 108. Current 302 may also flow through a body of the low-side GaN switch 104 causing a relatively large voltage drop from the source terminal 132 to the drain terminal 134. The drain 554 of the sensing transistor 514 is connected to the drain of 134 of the low-side GaN switch 104. Thus, if a voltage at the drain 554 falls, as shown in diagram 610, below a gate voltage of the sensing transistor 514 minus its threshold voltage (Vth), then the source 558 of the sensing transistor 514 gets pulled down. A gate voltage at gate 556 of the sensing transistor 514 may be biased by a resistor divider ratio of resistors 516 and 520. When the voltage at source 558 goes low, an output signal at output node 524 goes high as shown in diagram 612. Thus, a signal at node 532 goes low as shown in diagram 614, since the signal at node 532 is an inverted version of a signal at output node 524.

The signals at nodes 528 and 532 can be received by the NOR gate 546, where the NOR gate 546 generates a pulse at node 548 as shown in diagram 616. The signal at node 548 is received by the Set input of the latch 550, which generates an output signal at node 552 as shown in diagram 618. The signal at node 552 can be used to turn on the gate of the low-side GaN switch 104. The signal at output node 524 can be received by the second pulse generator circuit 534, where the second pulse generator circuit 534 can generate a signal at the output node 536 as shown in diagram 620. Similar to the description above with respect to operation of the first pulse generator circuit 508 and inverter 526, a fixed time duration pulse 622 is generated at node 540. The signal at node 540 is received by the third pulse generator circuit 542, where the third pulse generator circuit 542 generates an output signal 624 at node 544. In some embodiments, the time duration of the second pulse generator circuit 534 and the time duration of the third pulse generator circuit 542 can be set based on the motor drive system specifications. The signal at node 544 can be received by the Reset input of the latch 550, and used to reset the latch 550. Thus, the gate signal on the gate of the low-side GaN switch 104 goes low.

Figure 7A:
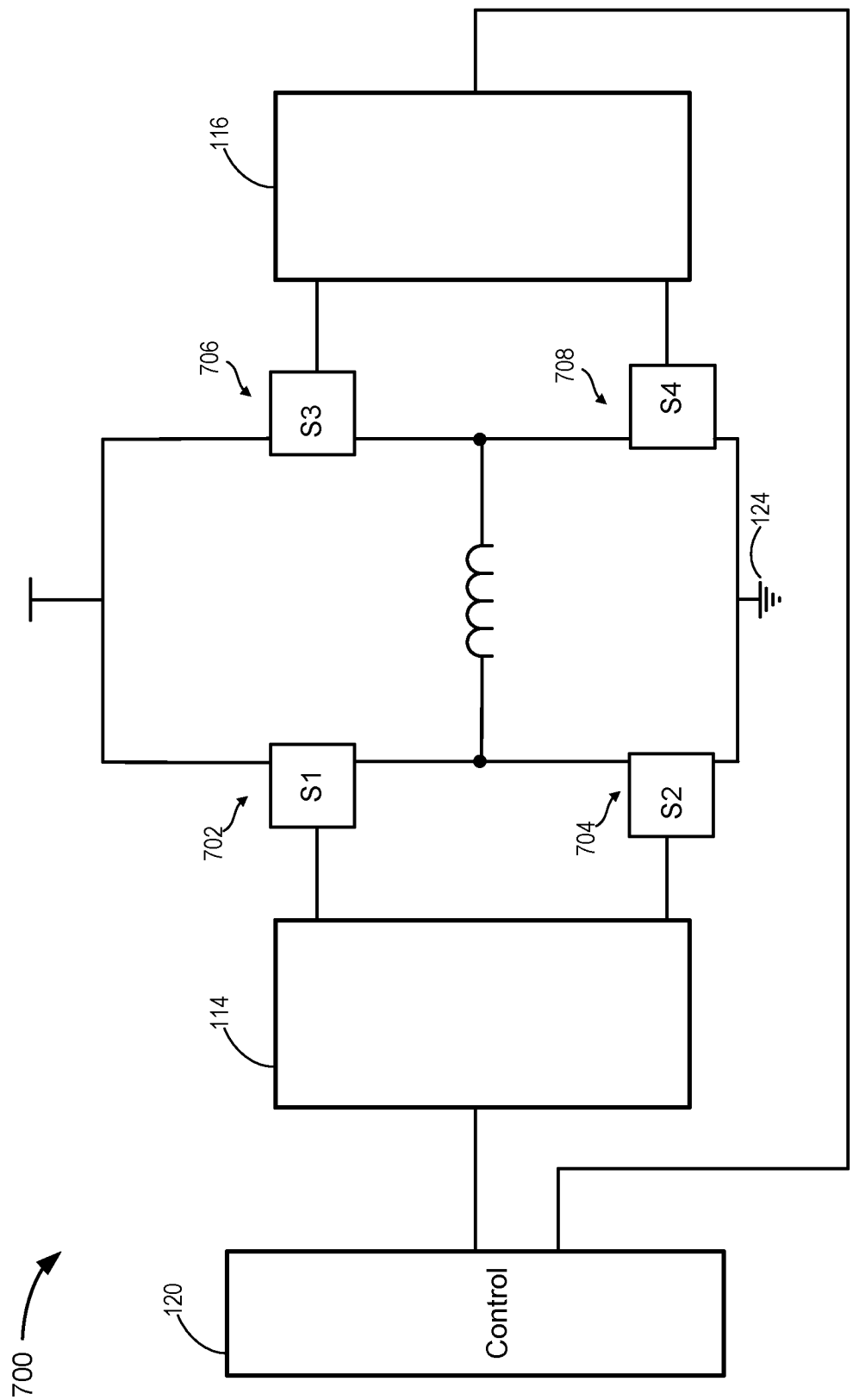
FIG. 7A illustrates a schematic of a GaN half-bridge motor drive circuit, according to an embodiment of the disclosure.

In various embodiments, the low-side GaN switch 104 can be turned off by using a zero current detection (ZCD) technique, according to certain embodiments. FIG. 7A illustrates a schematic of a GaN half-bridge motor drive circuit 700 according to an embodiment of the disclosure. The GaN half-bridge motor drive circuit 700 is similar to the GaN half-bridge motor drive circuit 100 except the switches 102, 104, 106 and 108 have been replaced by composite switches 702 (S1), 704 (S2), 706 (S3), and 708 (S4), respectively. Each of the composite switches S1, S2, S3 and S4 can include a GaN power switch coupled to a sense device and a zero current detection (ZCD) circuit. In some embodiments, the ZCD circuit can be integrated on the same GaN-based die as the GaN power switch. In various embodiments, the ZCD circuit can be integrated in the first and second drive circuits 114 and 116. The ZCD circuit can detect when a current through the GaN power switch reaches zero, or substantially zero, and in response can turn off the GaN power switch. In some embodiments, the ZCD circuit may be formed in a separate silicon-based die.

Figure 7B:
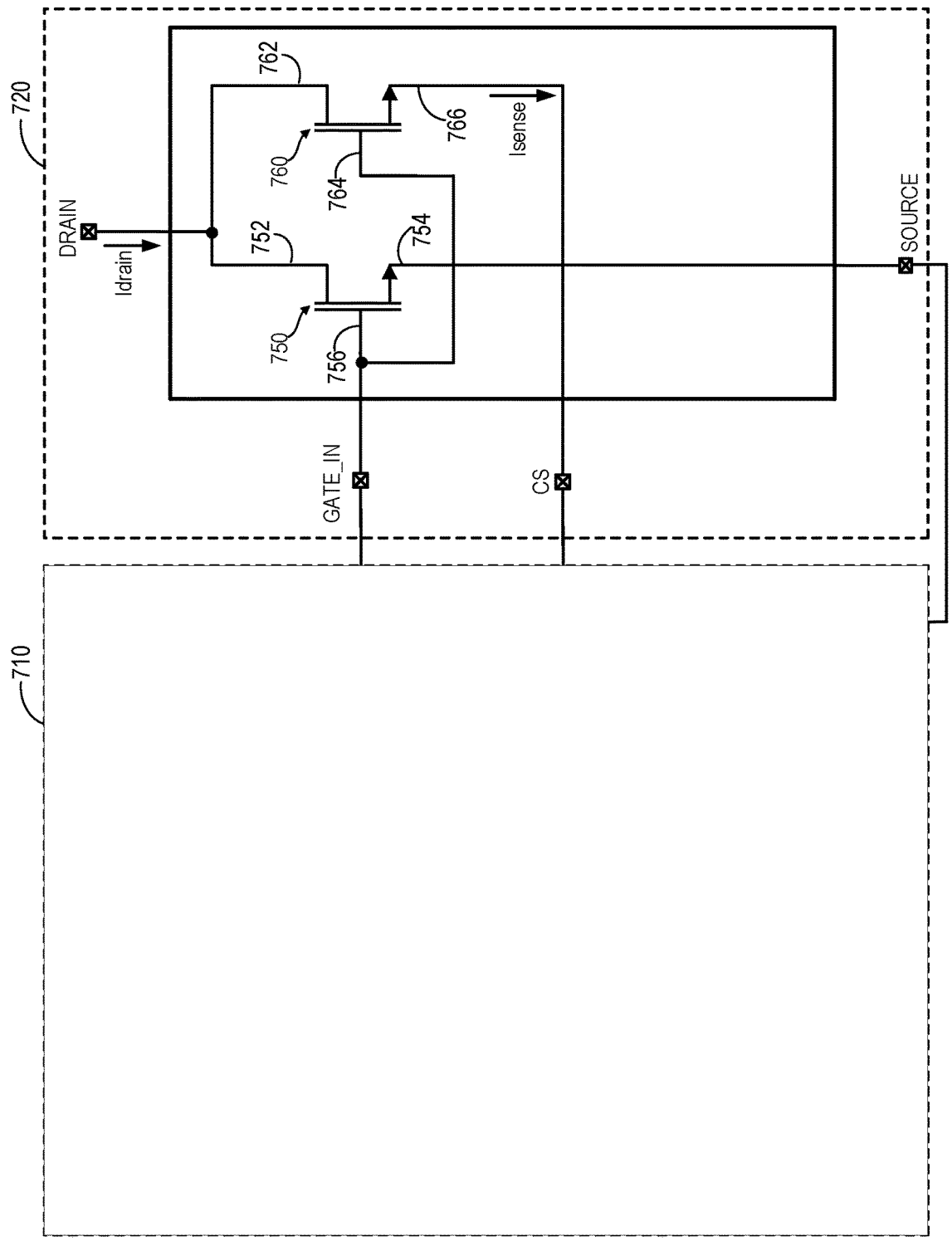
FIG. 7B illustrates a schematic of a composite switch along with a zero current detection circuit, according to an embodiment of the disclosure.

FIG. 7B illustrates a schematic of a composite switch 720 along with a ZCD circuit 710, according to an embodiment of the disclosure. As the shown in FIG. 7B, each of the composite switches S1, S2, S3 and S4 may include a composite switch 720. The composite switch 720 may include a GaN power switch 750 having a drain terminal 752, a gate terminal 756 and a source terminal 754. The composite switch 720 can further include a sense switch 760 coupled in parallel with the GaN power switch 750. The sense switch 760 can have a drain terminal 762, a gate terminal 764 and a source terminal 766. The sense switch 760 can be arranged to detect a magnitude and a polarity of a current flowing from drain terminal 752 to the source terminal 754. The sense switch 760 can further be arranged to transmit a first signal including at least one of a magnitude and polarity of the current through the GaN power switch 750. In some embodiments the composite switch 720 may GaN-based.

The ZCD circuit 710 can be coupled to the composite switch 720. The ZCD circuit 710 can be arranged to receive the first signal from the composite switch 720. The ZCD circuit can include a first driver circuit coupled to the gate terminal 756. The first driver circuit may be arranged to transmit control signals to the gate terminal 756 based on the signal from the composite switch 720. When a magnitude of the current flowing through the source terminal 754 to the drain terminal 752 falls below a predefined threshold value, for example, 10% of the rated current of GaN power switch 750, the ZCD circuit can turn off the composite switch S2. As appreciated by one of ordinary skill in the art having the benefit of this disclosure, the predefined threshold value can be set to any suitable value. In some embodiments, the ZCD circuit 710 can be formed in a silicon-based die and the composite switch 720 can be formed in a GaN-based die and both of the dies can be integrated in a single semiconductor package. In various embodiments, the ZCD circuit 710 can be formed as part of the driver circuits 114 an/or 116. In some embodiments, both the ZCD circuit 710 and the composite switch 720 can be formed in a GaN-based die.

In some embodiments, the GaN power switch 750 may be rated at 0.1 to 15 A. In various embodiments, the GaN power switch 750 may be rated at 5 to 12 A, while in other embodiments the GaN power switch 750 may be rated at 7 to 9 A. As appreciated by one of ordinary skill in the art having the benefit of this disclosure, the current rating of the GaN power switch 750 can be set to any suitable value. Subsequent to the current through S2 going to substantially zero and when VDS of GaN power switch 750 goes to a high state, the arming signal can go high again. When the arming signal is low, it can prevent an unwanted turn-on of the GaN power switch 750, which may happen due to ringing at the first switch node 110. In some embodiments, a voltage at the drain terminal 752 can be monitored and when the voltage at the drain terminal drops below a predetermined threshold, the GaN power switch 750 can be turned off.

In some embodiments, a method of turning off the low-side GaN switch 104 can be performed by including an internal fixed time duration after the INH signal goes high. In various embodiments an internal fixed time duration can be implemented within the drive circuit. In some embodiments, the low-side GaN switch 104 can be turned off by an external fixed time duration using an additional pin in the drive circuit integrated circuit (IC). The control circuit 120 can control the fixed time duration based on expected third quadrant mode of operation of the low-side GaN switch 104.

In some embodiments, the low-side GaN switch 104 can be turned off by sending an external relatively short duration pulse, e.g., 20 ns, to a low-side control signal (INL) pin without using an additional pin. The short duration pulse can indicate that the low-side GaN switch 104 may be turned off after the autonomous turn-on of the low-side GaN switch 104 has begun. When the drain-to-source (VDS) voltage of the low-side GaN switch 104 goes negative, the low-side GaN switch 104 can be turned on. Subsequently, a timer may be started. A time period of the timer can have any suitable length, for example, it can be a hundred nanoseconds. In some embodiments, it can be a microsecond. After that timer expires, the low-side GaN switch 104 can be turned off. In various embodiments, the low-side GaN switch 104 can be turned off by sending an external relatively short duration pulse, e.g., 20 ns, to a high-side control signal (INH) pin without using an additional pin. This external relatively short duration pulse can be coded to signify that when the low-side GaN switch 104 gate is on, and it receives this relatively short duration pulse, it turns off the low-side GaN switch 104.

In some embodiments, when the motor drive circuit is in a continuous current mode (CCM) of operation, the low-side GaN switch 104 may be turned off prior to the control circuit 120 turning on the high-side GaN switch 102. In this embodiment, when the low-side GaN switch 104 is its third quadrant mode of operation, and when the control circuit 120 sends an INH high signal to the high-side GaN switch 102, a low side logic circuit can intercept the INH signal going to the high-side GaN switch 102, checks to see whether the low-side GaN switch 104 is on, and if the low-side GaN switch 104 is on, turns it off and then sends the INH high signal to the high-side GaN switch 102. If the low-side GaN switch 104 is not on, the low-side logic sends the INH high signal directly to the high-side GaN switch 102.

In various embodiments, a similar method as described above can be used to turn off the high-side GaN switch 102 when INL goes high. When the high-side GaN switch 102 is its third quadrant mode of operation, and when the control circuit 120 sends an INL high signal to the low-side GaN switch 104, a low side logic circuit can intercept the INH signal going to the high-side GaN switch 102, can check to see whether the low-side GaN switch 104 is on, and if the low-side GaN switch 104 is on, turns it off and then sends the INH high signal to the high-side GaN switch 102. If the low-side GaN switch 104 is not on, the low-side logic sends the INH high signal directly to the high-side GaN switch 102.

In some embodiments, when the control circuit 120 sends an INL high signal, the low-side logic can first send an off signal to the high-side GaN switch. This is done irrespective of whether the high-side GaN switch is on or off. Subsequently, the low-side logic can send an on signal to the high-side GaN switch after a predetermined period of time. This can prevent both the high-side and low-side GaN switches from being on at the same time.

In various embodiments, the disclosed motor drive circuits can be monolithically integrated onto a single die. In some embodiments, the disclosed motor drive circuits can include a first half-bridge circuit, a second half-bridge circuit and a third half-bridge circuit. In various embodiments, the first, second and the third half-bridge circuits may be formed within separate individual die. In some embodiments, the first, second and the third half-bridge circuits, and the drive circuits and any combination of them can be formed in groups on separate die, for example, the first, second and the third half-bridge circuits can be formed on a single die and the drive circuits may be formed on a separate die, or the first, second and the third half-bridge circuits can be formed on the same die as the drive circuits. In various embodiments, the first, second and the third half-bridge circuits and the drive circuits can be formed on the same GaN die. In some embodiments, the first, second and the third half-bridge circuits and the drive circuits can be formed on the same die as the controller.

In some embodiments, the described switches can be formed in silicon, or any other semiconductor material. In various embodiments, the described switches can be metal oxide semiconductor field effect transistors (MOSFETs). In some embodiments, the disclosed MOSFETS can all be formed on one single die well.

In various embodiments, the first, second and the third half-bridge circuits, the drive circuits and the logic and control circuits can all be integrated into one electronic package, for example, but not limited to, into a quad-flat no-lead (QFN) package, or into a dual-flat no-leads (DFN) package, into a ball grid array (BGA) package. In some embodiments, the first, second and the third half-bridge circuits can be individually packaged into an electronic package. In various embodiments, controller circuits and/or control logic circuits can be integrated into a single die along with the disclosed motor drive circuits.

In some embodiments, combination of the circuits and methods disclosed herein can be utilized to improve efficiency of motor drive circuits. Although circuits and methods are described and illustrated herein with respect to several particular configuration of a motor drive circuit, embodiments of the disclosure are suitable for using in other power converter circuits such as, but not limited to, buck converters.

In the foregoing specification, embodiments of the disclosure have been described with reference to numerous specific details that can vary from implementation to implementation. The specification and drawings are, accordingly, to be regarded in an illustrative rather than a restrictive sense. The sole and exclusive indicator of the scope of the disclosure, and what is intended by the applicants to be the scope of the disclosure, is the literal and equivalent scope of the set of claims that issue from this application, in the specific form in which such claims issue, including any subsequent correction. The specific details of particular embodiments can be combined in any suitable manner without departing from the spirit and scope of embodiments of the disclosure.

Additionally, spatially relative terms, such as "bottom or "top" and the like can be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, if the device in the figures is turned over, elements described as a "bottom" surface can then be oriented "above" other elements or features. The device can be otherwise oriented (e.g., rotated 90 degrees or at other orientations) and the spatially relative descriptors used herein interpreted accordingly.

Terms "and," "or," and "an/or," as used herein, may include a variety of meanings that also is expected to depend at least in part upon the context in which such terms are used. Typically, "or" if used to associate a list, such as A, B, or C, is intended to mean A, B, and C, here used in the inclusive sense, as well as A, B, or C, here used in the exclusive sense. In addition, the term "one or more" as used herein may be used to describe any feature, structure, or characteristic in the singular or may be used to describe some combination of features, structures, or characteristics. However, it should be noted that this is merely an illustrative example and claimed subject matter is not limited to this example. Furthermore, the term "at least one of" if used to associate a list, such as A, B, or C, can be interpreted to mean any combination of A, B, and/or C, such as A, B, C, AB, AC, BC, AA, AAB, ABC, AABBCCC, etc.

Reference throughout this specification to "one example," "an example," "certain examples," or "exemplary implementation" means that a particular feature, structure, or characteristic described in connection with the feature and/or example may be included in at least one feature and/or example of claimed subject matter. Thus, the appearances of the phrase "in one example," "an example," "in certain examples," "in certain implementations," or other like phrases in various places throughout this specification are not necessarily all referring to the same feature, example, and/or limitation. Furthermore, the particular features, structures, or characteristics may be combined in one or more examples and/or features.

In the preceding detailed description, numerous specific details have been set forth to provide a thorough understanding of claimed subject matter. However, it will be understood by those skilled in the art that claimed subject matter may be practiced without these specific details. In other instances, methods and apparatuses that would be known by one of ordinary skill have not been described in detail so as not to obscure claimed subject matter. Therefore, it is intended that claimed subject matter not be limited to the particular examples disclosed, but that such claimed subject matter may also include all aspects falling within the scope of appended claims, and equivalents thereof.

What is claimed is:

1. A method of operating a motor drive circuit, the method comprising:
    providing a half-bridge circuit including:
        a high-side gallium nitride (GaN) switch having a first gate terminal, a first drain terminal and a first source terminal; and
        a low-side GaN switch having a second gate terminal, a second drain terminal and a second source terminal, wherein the first drain terminal is coupled to a power supply, the first source terminal is coupled to the second drain terminal at an output node and the second source terminal is coupled to a ground;
    providing a motor coupled to the output node;
    turning on the high-side GaN switch such that a first current flows through the motor;
    turning off the high-side GaN switch;

turning on the low-side GaN switch when a voltage between the second drain terminal and the second source terminal drops below a predetermined threshold voltage;

sensing, using a sense device coupled to the low-side GaN switch, a magnitude of a second current that flows through the low-side GaN switch; and turning off the low-side GaN switch when the magnitude of the second current drops below a predetermined threshold current.

2. The method of claim 1, wherein turning on the low-side GaN switch is performed within a predetermined period of time after a control signal that controls a conductivity state of the high-side GaN switch goes high.

3. The method of claim 1, further comprising turning off the low-side GaN switch prior to turning on the high-side GaN switch if a control signal that controls a conductivity state of the high-side GaN switch goes high after the low-side GaN switch is turned on.

4. The method of claim 1, wherein the predetermined threshold current has a value that is 10% of a rated current of the low-side GaN switch.

5. The method of claim 1, wherein the predetermined threshold voltage is a first predetermined threshold voltage, and wherein the method of claim 1 further comprises transmitting an arming signal to the low-side GaN switch when the voltage between the second drain terminal and the second source terminal exceeds a second predetermined threshold voltage, and wherein the arming signal goes low prior to the low-side GaN switch turning on.

6. The method of claim 5, wherein a value of the first predetermined threshold voltage is −1.0 V, and wherein a value of the second predetermined threshold voltage is 12.0 V.

7. The method of claim 1, wherein the half-bridge circuit is a first half-bridge circuit and the output node is a first output node, and wherein the method of claim 1 further comprises a second half-bridge circuit having a second output node, wherein the motor is coupled between the first output node and the second output node.

8. A circuit comprising:
a high-side gallium nitride (GaN) switch having a first gate terminal, a first drain terminal and a first source terminal;
a low-side GaN switch having a second gate terminal, a second drain terminal and a second source terminal, wherein the first drain terminal is coupled to a power supply, the first source terminal is coupled to the second drain terminal at an output node and the second source terminal is coupled to a ground;
a drive circuit coupled to the high-side GaN switch and to the low-side GaN switch; and
a sense device coupled to the low-side GaN switch and arranged to sense a magnitude of a current that flows through the low-side GaN switch;
wherein the drive circuit is arranged to:
turn on the high-side GaN switch when a control signal that controls a conductivity state of the high-side GaN switch goes high;
turning off the high-side GaN switch when the control signal goes low;
turn on the low-side GaN switch when a voltage between the second drain terminal and the second source terminal drops below a predetermined threshold voltage; and
turn off the low-side GaN switch when the magnitude of the current drops below a predetermined threshold current.

9. The circuit of claim 8, wherein the drive circuit is further arranged to turn on the low-side GaN switch within a predetermined period of time after the control signal goes high.

10. The circuit of claim 8, wherein the drive circuit is further arranged to turn off the low-side GaN switch prior to turning on the high-side GaN switch if the control signal goes high after the low-side GaN switch is turned on.

11. The circuit of claim 8, wherein the predetermined threshold current has a value that is 10% of a rated current of the low-side GaN switch.

12. The circuit of claim 8, wherein the predetermined threshold voltage is a first predetermined threshold voltage, and wherein the drive circuit is further arranged to transmit an arming signal to the low-side GaN switch when the voltage between the second drain terminal and the second source terminal exceeds a second predetermined threshold voltage, and to set the arming signal to a low state prior to the low-side GaN switch turning on.

13. The circuit of claim 8, wherein the drive circuit is formed in silicon.

14. A method of operating a motor drive circuit, the method comprising:
providing a half-bridge circuit including:
a high-side gallium nitride (GaN) switch having a first gate terminal, a first drain terminal and a first source terminal; and
a low-side GaN switch having a second gate terminal, a second drain terminal and a second source terminal, wherein the first drain terminal is coupled to a power supply, the first source terminal is coupled to the second drain terminal at an output node and the second source terminal is coupled to a ground;
providing a motor coupled to the output node;
turning on the high-side GaN switch such that a first current flows through the motor;
turning off the high-side GaN switch;
turning on the low-side GaN switch when a voltage between the second drain terminal and the second source terminal drops below a predetermined threshold voltage; and
turning off the low-side GaN switch when the voltage between the second drain terminal and the second source terminal exceeds the predetermined threshold voltage.

15. The method of claim 14, wherein turning on the low-side GaN switch is performed within a predetermined period of time after a control signal that controls a conductivity state of the high-side GaN switch goes high.

16. The method of claim 14, further comprising turning off the low-side GaN switch prior to turning on the high-side GaN switch if a control signal that controls a conductivity state of the high-side GaN switch goes high after the low-side GaN switch is turned on.

17. The method of claim 14, wherein the predetermined threshold voltage is a first predetermined threshold voltage, and wherein the method of claim 1 further comprises transmitting an arming signal to the low-side GaN switch when the voltage between the second drain terminal and the second source terminal exceeds a second predetermined threshold voltage, and wherein the arming signal goes low prior to the low-side GaN switch turning on.

18. The method of claim 17, wherein a value of the first predetermined threshold voltage is −1.0 V, and wherein a value of the second predetermined threshold voltage is 12.0 V.

19. The method of claim 14, further comprising providing a drive circuit coupled to the high-side GaN switch and to the low-side GaN switch.

20. The method of claim 19, wherein the drive circuit includes a comparator arranged to detect the voltage between the second drain terminal and the second source terminal.

\* \* \* \* \*